(12) United States Patent
Tamai et al.

(10) Patent No.: US 6,172,552 B1
(45) Date of Patent: Jan. 9, 2001

(54) FET DEVICE FOR USE IN SOLID-STATE RELAY

(75) Inventors: Hidefumi Tamai, Tokyo; Masaya Fukaura, Kumamoto, both of (JP)

(73) Assignee: NEC Corporation, Tokyo (JP)

(*) Notice: Under 35 U.S.C. 154(b), the term of this patent shall be extended for 0 days.

(21) Appl. No.: 09/174,837

(22) Filed: Oct. 19, 1998

(30) Foreign Application Priority Data

Oct. 17, 1997 (JP) .................................................. 9-285761

(51) Int. Cl.$^7$ ................................................ H03K 17/687
(52) U.S. Cl. .................... 327/427; 327/428; 327/432; 327/434; 327/439; 327/440
(58) Field of Search ................................. 327/427, 428, 327/434, 432, 439, 440

(56) References Cited

U.S. PATENT DOCUMENTS 4,680,490 * 7/1987 Baker ..................................... 307/575
5,559,466 * 9/1996 Okumura et al. ..................... 327/514

FOREIGN PATENT DOCUMENTS

| 62-12167 | 1/1987 | (JP) . |
| 63-2422 | 1/1988 | (JP) . |
| 3-46410 | 2/1991 | (JP) . |
| 3-129920 | 6/1991 | (JP) . |
| 4-20010 | 1/1992 | (JP) . |

* cited by examiner

*Primary Examiner*—Margaret R. Wambach
*Assistant Examiner*—Cassandra Cox
(74) *Attorney, Agent, or Firm*—Hutchins, Wheeler & Dittmar (57) ABSTRACT

In an FET device having a pair of input terminals, a pair of output terminals, a plurality of FETs and driving circuits, the driving circuit has such a circuit structure that source electrodes of the FETs are electrically connected to each other. Each of gate electrodes of the FETs is independently connected to a photo-diode array. The gate electrodes of the FETs are not electrically short-circuited to each other. The FETs are tuned on and off in response to a single control signal.

21 Claims, 4 Drawing Sheets

FET DEVICE FOR USE IN SOLID-STATE RELAY

BACKGROUND OF THE INVENTION

This invention relates to a Field Effect Transistor (FET) device which is used for a solid-state relay which has no contact and which is mechanically operable, and a solid-state relay thereof.

In general, an FET device of the type described includes a pair of input terminals and a pair of output terminals. In this condition, the FET device carries out an on-off operation in response to a control signal applied to the input terminals, and supplies an output signal into an integrated circuit (IC) which is connected to the output terminals as a load circuit. Thus, the FET device is used as a solid-state relay for an IC tester and the like.

In such a solid-state relay, the output signal which is supplied from the solid-state relay often has high frequency with high density of the IC. To this end, it is required that the solid-state relay itself has such a structure that a high frequency signal can pass therethrough.

Therefore, the FET as a solid switch device that constitutes a circuit structure and the solid-state relay has been generally improved in such a solid-state relay, which the high frequency signal must be passed as the output signal.

Conventionally, the solid-state relay, which is combined FETs with a thyristor, is disclosed in Japanese Unexamined Patent Publication No. Sho. 63-2422 (hereinafter referred to as a first reference). In this event, the first reference discloses the solid-state relay which achieves high speed by improving the circuit structure.

Further, an example of a MOSFET which is used for the solid-state relay is disclosed in Japanese Unexamined Patent Publication No. Sho. 62-12167 (hereinafter referred to as a second reference). The MOSFET is a vertical type, and operable with enhancement mode.

Moreover, another solid-state relay is disclosed in Japanese Unexamined Patent Publication No. Hei. 5-41653 (thereinafter, referred to as a third reference).

In the solid-state relay, controlling two input signals can control polarity of current, which flows through a load circuit. Further, an exclusive OR between two input signals can be obtained as an output signal of the solid-state relay.

In this case, a product (namely, CR product) between device capacitance and on-resistance is generally used is a factor for evaluating a device that is used as the solid-state relay. In this event, when the CR product is small, the output signal of high frequency can be controlled.

In this event, when the solid-state relay in the first reference is used to control the high frequency signal, the high frequency signal passes between a pair of output terminals. It is necessary to use a device having a small CR product in the solid-state relay for passing the high frequency signal. This is because the solid-state relay can pass the high frequency as the CR product between the output terminals is small.

On the other hand, when the MOSFET itself in the second reference is used, a device breakdown voltage (namely, device breakdown voltage between a drain and a source during an off state) is about 50 V, the on resistance is about 10$\Omega$, and the CR product is approximately 20 pF·$\Omega$. These values are extremely small as compared to the other devices.

Under such a circumstance, the MOSFET having the small CR product is generally used in the solid-state relay. In this event, when the solid-state relay in the first reference is structured by using the MOSFET in the second reference, it is confirmed that the CR product between a pair of output terminals is approximately 30 pF·$\Omega$.

As mentioned before, it is recently required to control the high frequency signal by the use of the solid-state relay in the market regarding communication. However, the CR product of the conventional solid-state relay has a limit of 30 pF·$\Omega$ (the device breakdown voltage is about 50 V, and the on-resistance is approximately 10$\Omega$) under zero-bias. Only a signal, which has frequency less than several MHz, can be controlled by the above CR product. In other words, it is found out that it is difficult to use the above-mentioned solid-state relay so as to control the high frequency signal exceeding several MHz.

Moreover, it may be possible to reduce the CR product of the solid-state relay in the first reference by reducing the CR product of the MOSFET itself. However, it is also confirmed that it is technically difficult to further reduce the CR product by the use of the MOSFET itself.

On the other hand, the above-mentioned third reference discloses the solid-state relay for obtaining the output signal in accordance with the two input signals. Namely, although the third reference discloses the solid-state relay which obtains the output signal corresponding to the two input signals via the two output terminals, no attention is paid for such a case that the output signal which is directly irrespective of the input signals is given to the output terminal, and the output signal is turned on and off.

In addition, the third reference does not suggest measures for the case that the output signal, which is turned on and off, has the high frequency.

SUMMARY OF THE INVENTION

It is therefore an object of this invention to provide a solid state relay, which is capable of controlling a high frequency signal of several MHz, or more which is given as an output signal.

It is another object of this invention to provide an FET device that has a CR product smaller than that of the FET device itself.

It is still another object of this invention to provide an FET device which is capable of realizing a small CR product.

According to this invention, an FET device includes a pair of input terminals, a pair of output terminals, a plurality of FETs, and driving circuits.

In this event, the input terminals are given a single control signal while the output terminals supply a single output signal.

Further, the FETs are connected between the output terminals. Herein, each of the FETs has a source electrode, a drain electrode and a gate electrode.

Moreover, the driving circuits are independently connected between the input terminals and the FETs, respectively.

Under this circumstance, the driving circuit has such a circuit structure that the source electrodes of the FETs are electrically connected to each other. Further, each of the gate electrodes of the FETs is independently connected to a photo-diode array. In addition, the gate electrodes of the FETs are not electrically short-circuited to each other.

In this condition, the FETs are tuned on and off in response to the single control signal.

In consequence, the FET device having the CR product equivalent to the single device can be realized. As a result, the solid-state relay can control the high frequency signal of 6 MHz or more.

DETAILED DESCRIPTION OF THE PREFERRED EMBODIMENTS

Figure 1:
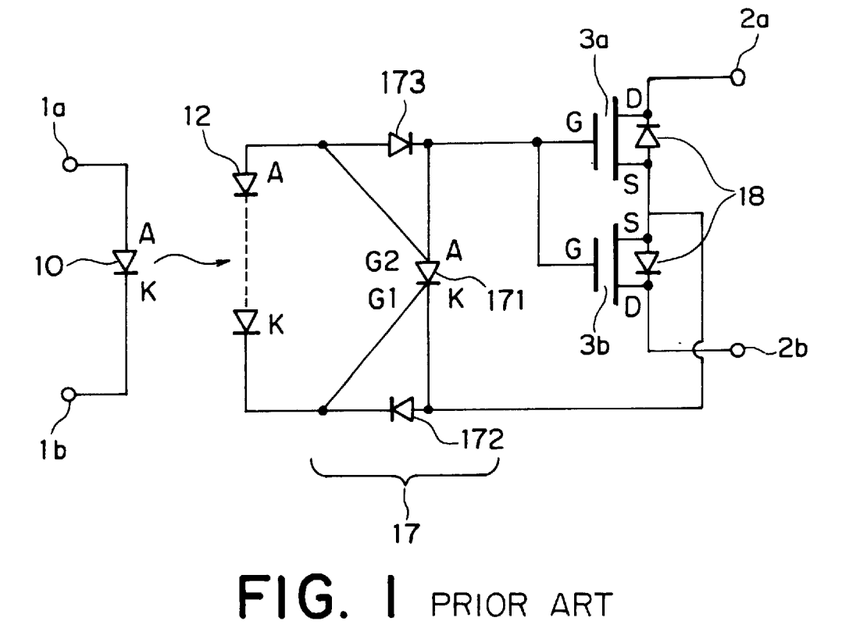
FIG. 1 is a circuit diagram showing an FET devices, which is conventionally used as a solid-state relay.
Figure 2:
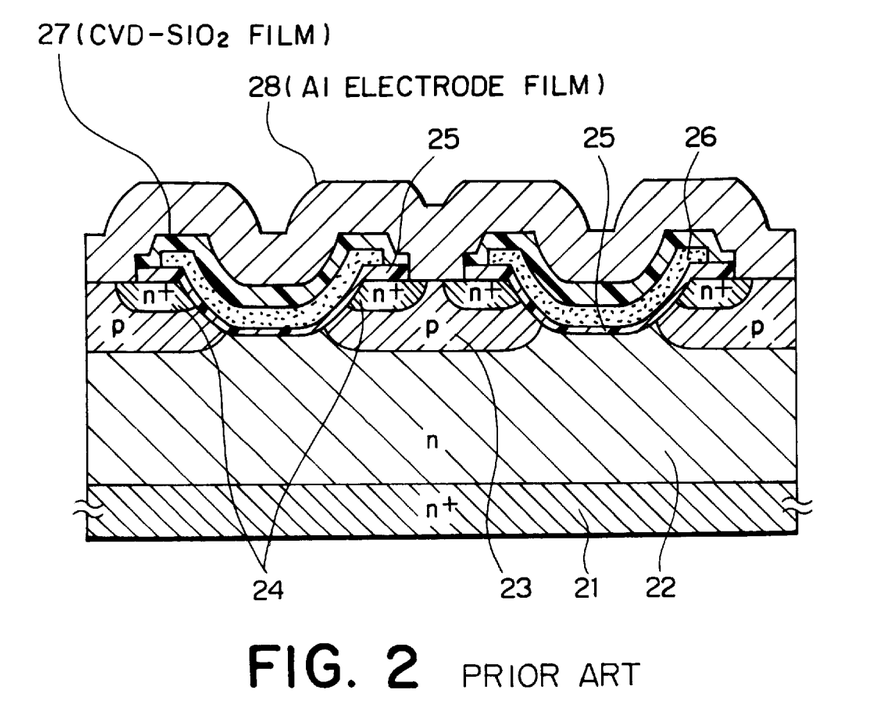
FIG. 2 is a cross sectional view showing a vertical type MOSFET that is used in a conventional solid-state relay.

Referring to FIGS. 1 and 2, a conventional FET device (namely, solid-state relay) will be first described for a better understanding of this invention. The FET device is equivalent to the conventional FET devices in the first reference mentioned in the preamble of the instant specification.

Referring to FIG. 1, description will be made about the solid-state relay disclosed in the first reference.

A solid-state relay illustrated in FIG. 1 has a pair of input terminals 1a and 1b, and a pair of output terminals 2a and 2b. Further, two MOSFETs 3a and 3b (thereinafter, abbreviated as a FET) are connected between a pair of output terminals 2a and 2b.

In this event, each of the FET 3a and 3b includes a gate electrode G, a drain electrode D, and a source electrode S. Herein, it is to be noted that a load circuit (not shown), which is turned on and off by the solid-state relay, is connected to an external of the output terminals 2a and 2b.

The illustrated gate electrodes G of the FETs 3a and 3b are connected to each other and namely, are short-circuited to each other. Further, the drain electrode D of the FET 3a and the drain electrode D of the FET 3b are connected to the output terminals 2a and 2b, respectively.

Moreover, the source electrodes S of both FET 3a and 3b are connected in common. Thus, the source electrode S of both FETs 3a and 3b are also short-circuited.

On the other hand, a gate driving circuit (namely, a driving circuit) is connected between the FETs 3a, 3b and the input terminals 1a and 1b in the illustrated example. As mentioned before, the gate electrodes G and the source electrodes S are connected in common, respectively.

In this case, the gate driving circuit is composed of an input circuit, which is connected between a pair of input terminals 1a and 1b, and a gate circuit portion, which is, arranged between the input circuit and the gate electrodes G.

The input circuit has a light-emitting device 10, which converts an input electrical signal given as a control signal into an optical signal.

On the other hand, the gate circuit portion is structured by a photo-diode array 12 which receives or detects a light beam from the light-emitting device 10 and converts the light beam into a voltage signal, and a discharge short circuit 17 which rapidly discharges carriers collected in the gates G when each of the FETs 3a and 3b is in an off state.

In the illustrated photo-diode array 12, a plurality of photo-diode devices are connected in series. In the illustrated example, the photo-diode array 12 has an anode A and a cathode K of the photo-diodes at both ends.

On the other hand, the illustrated discharge short circuit includes a thyristor 171, which is composed of an anode A, a cathode K and two gates consisting of a P-pole gate G1 and an N-pole gate G2. In this event, the P-pole gate G1 of the illustrated thyristor 171 is connected to the cathode K of the photo-diode array 12 while the N-pole gate G2 is connected to the anode A of the photo-diode array 12.

Further, the cathode K and the P-pole gate G1 of the thyristor 171 are connected to an anode and a cathode of the diode 172, respectively. On the other hand, the anode A and the N-pole gate G2 of the thyristor 171 are connected to a cathode and an anode of a diode 173, respectively.

The anode A of the thyristor 171 which constitutes the illustrated gate circuit portion is connected to the gates G of the FETs 3a and 3b which are connected in common. On the other hand, the cathode K of the thyristor 171 is connected to the source electrodes S of the FETs 3a and 3b, which are connected in common.

Subsequently, description will be made about an operation of the illustrated solid-state relay.

A current flows as a control signal between the anode A and the cathode K of the light-emitting device 10, which constitutes the input circuit. Consequently, the light-emitting device 10 emits the light beam, and the light beam is detected by the photo-diode array 12.

When the photo-diode array 12 detects the light beam from the light-emitting device 10, a plus voltage is generated at the anode side of the photo-diode array 12. In consequence, the FETs 3a and 3b is turned on by the generated voltage.

As a result, each of the FETs 3a and 3b is put into an operation state. During the operation of both FETs 3a and 3b, the photo-diode array 12 and the discharge short-circuit 17 (namely, thyristor 171) are kept in an off state.

Next, when no current is applied to the light emitting device 10, the voltage of the photo-diode array 12 is eliminated. At this time, the carriers, which are, collected in the gate electrodes G of the FET 3a and the FET 3b starts discharging. However, the discharge of the carriers is prevented by the diode 173 in the discharge short circuit 17 because the diode 173 is connected in a reverse direction against the gate electrode G. Further, the thyristor 171 itself in the discharge short circuit 17 is put into the off state. In such a state, only a leakage current is discharged through the diode 173 and the thyristor 171.

Therefore, when the thyristor 171 does not operate, gate potential of each FET 3a, 3b is reduced with duration between several hundreds msec. and several sec.

However, recombination of the carriers proceeds inside the photo-diode array 12, which lost the emitted light beam. In consequence, the potential of the anode A of the photo-diode array 12 is quickly reduced in voltage in comparison with reduction of the gate potential of the gate electrode G of each FET 3a, 3b.

In this state, when potential difference between the anode A of the photo-diode array 12 and the gate potential of the gate electrode G of each FETs 3a, 3b exceeds a threshold voltage (about 0.6 V) of the thyristor 171 in the discharge short circuit 17, the thyristor 171 becomes an on state to operate.

When the thyristor 171 is put into the on state, the carriers, which are collected in the gates G of the FETs 3a and 3b, are rapidly discharged via the thyristor 171.

On the other hand, a p-layer of a reverse region and an $n^+$-layer of a source region are electrically short-circuited in order to prevent an operation of a transistor which is formed by an n-layer of a drain region, the p-layer and the $n^+$-layer in each of the FETs 3a and 3b.

Thus, when the reverse region and the source region are electrically short-circuited, a parasitic diode 18 is inevitably formed between the source electrode S and the drain electrode D of each FETs 3a, 3b.

In the solid-state relay, such a state (namely, by-directional reverse-blocking state) that an alternating signal passes between the output terminal 2a and the output terminal 2b is often required. To this end, such a structure that each source electrode S of each FET 3a, 3b is short-circuited to each other is adopted, as illustrated in FIG. 1.

In the solid-state relay having the above-mentioned circuit structure, the thyristor 171 is used for the discharge short circuit 17. Consequently, the switching operation can be stably carried out at high-speed.

Subsequently, description will be made about an example of the MOSFET, which is used, in the solid-state relay described in the second reference with reference to FIG. 2.

The illustrated MOSFET is the vertical type, and is operable with enhancement mode. Further, the MOSFET includes an $n^+$-type semiconductor substrate 21, an n-type semiconductor layer 22, p-type first semiconductor layers 23 and $n^+$-type second semiconductor layers 24.

Herein, the p-type first semiconductor layers 23 are formed on the n-type semiconductor layer 22 with a predetermined distance while the $n^+$-type second semiconductor layers 24 are formed in the first semiconductor layer 23.

In this event, the $n^+$-type semiconductor substrate 21 is operable, as the drain while the second semiconductor layer 24 is operable as the source.

Moreover, a U-shaped type or a V-shaped type grooves are formed between the p-type first semiconductor layers 23. In this condition, a gate oxide film 25 is provided so as to cover the groove and a part of the second semiconductor layer 24.

In addition, a poly-silicon 26 and a CVD-$SiO_2$ film 27 are successively deposited on the gate oxide film 25. Further, an aluminum electrode 28 is formed on the $SiO_2$ film 27.

In such a vertical type MOSFET, a portion adjacent to the gate oxide film 25 has the U-shape or the V-shape. Thereby, gallery of a current, which flows between the source and the drain, can be reduced. Further, both an area for flowing at constant current and on-resistance can be reduced by improving efficiency for utilizing the gate area.

In the vertical type MOSFET illustrated in FIG. 2, the on-resistance can be practically reduced without an increase of device capacity.

In this case, a product (namely, CR product) between the device capacity and the on-resistance is generally used as a factor for evaluating a device, which is used as the solid-state relay. When the CR product is small, the output signal of high frequency can be controlled.

In this event, examination will be made about a case that the solid-state relay illustrated in FIG. 2 is used to control a high frequency signal. In this event, the high frequency signal passes between the output terminals 2a and 2b illustrated in FIG. 1.

It is necessary to use a device having a small CR product in the solid-state relay for passing the high frequency signal. This is because the solid-state relay can pass the high frequency as the CR product between the output terminal 2a and the output terminal 2b is small.

On the other hand, when the MOSFET illustrated in FIG. 2 is used, a device breakdown voltage (namely, a device breakdown voltage between a drain and a source during an off state) is about 50 V, the on resistance is about 10Ω, and the CR product is approximately 20 pF·Ω. These values are extremely small as compared to the other devices.

Under such a circumstance, the MOSFET, which is illustrated in FIG. 2 and has the small CR product is generally used in the solid-state relay. In this event, when the solid-state relay illustrated in FIG. 1 is structured by using the MOSFET illustrated in FIG. 2, it is confirmed that the CR product between a pair of output terminals 2a, 2b is approximately 30 pF·Ω.

As mentioned before, it is recently required to control the high frequency signal by the use of the solid-state relay in the market regarding communication. However, the CR product of the conventional solid-state relay has a limit of 30 pF·Ω (the device breakdown voltage is about 50 V, and the on-resistance is approximately 10Ω) under zero-bias. Only a signal, which has frequency less than several MHz, can be controlled by the above CR product.

In other words, it is found out that it is difficult to use the above-mentioned solid-state relay so as to control a high frequency signal exceeding several MHz.

Moreover, it may be possible to reduce the CR product of the solid-state relay illustrated in FIG. 1 by reducing the CR product of the MOSFET itself. However, it is also confirmed that it is technically difficult to further reduce the CR product by the use of the MOSFET itself.

Taking the above-mentioned problem into consideration, this invention provides a solid state relay which is capable of controlling a high frequency signal of more than several MHz which is given as an output signal and an FET device which is capable of realizing a small CR product.

Figure 3:
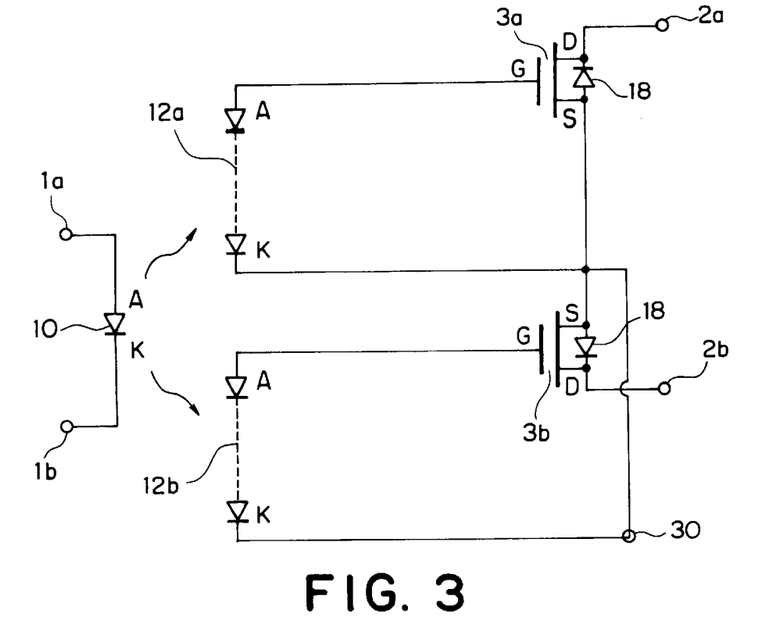
FIG. 3 is a circuit diagram for explaining a principle of this invention.

Referring to FIG. 3, description will first be made about a principle of this invention.

Herein, it is to be noted that the same reference numbers are attached for portions, which performs the same operation as FIG. 1. Namely, an FET device, which is operable as a solid-state relay illustrated in FIG. 3, includes a pair of input terminals 1a and 1b, a pair of output terminals 2a and 2b, and two MOSFET 3a and 3b (thereinafter, abbreviated as an FET) which are connected between output terminals 2a and 2b.

In the illustrated example, source electrodes S are connected in common in FETs 3a and 3b, and namely, are short-circuited. Further drains D of the FETs 3a and 3b are connected to output terminals 2a and 2b, respectively. Moreover, the source electrodes, which are connected in common, are connected to the predetermined connection point 30.

As shown in FIG. 3, gate electrodes G of the FETs 3a and 3b are not electrically short-circuited as the device from FIG. 1. In other words, a gate circuit portion is independently connected to the gate electrode of each the FETs 3a, 3b as a part of a gate driving circuit.

A light-emitting device 10 having an anode A and a cathode K is connected between the input terminals 1a and 1b as an input circuit. In this event, the light-emitting device 10 converts an input electrical signal into an optical signal. The converted optical signal is, given to the two gate circuit portions.

In the illustrated example, each of the two gate circuit portions has an anode A and a cathode K, and includes two photo-diode arrays 12a and 12b which convert the optical signal from the light-emitting device 10 into an electrical signal.

In this condition, the anode A of the photo-diode array 12a is a gate electrode G of the FET 3a while the cathode K of the photo-diode array 12a is connected to the predetermined connection point 30.

On the other hand, the anode A of the photo-diode array 12b is connected to the gate electrode G of the FET 3b while the cathode K is also connected to the predetermined connection point 30.

Thus, the illustrated gate circuit portion has such a circuit structure that different FETs 3a and 3b are driven by different photo-diode arrays 12a and 12b, respectively.

Herein, it is to be noted that the product (namely, the CR product) between the device capacity between the output terminals 2a and 2b and the on-resistance can be reduced to 20 pF·Ω near zero-bias when each of the FETs 3a and 3b shown in FIG. 3 has a structure illusrated in FIG. 2 and the FET having the CR product of 20 pF·Ω in zero bias is used.

This reason will be explained as compared to the conventional solid-state relay illustrated FIG. 1.

In the example illustrated in FIG. 1, the gate terminals G of the FET 3a and FET 3b are short-circuited, and are driven by the single photo-diode array 12. Therefore, each capacity (Cdg) between a drain and a gate of each FET 3a, 3b is connected to each other by short-circuiting the gates. This means that two capacities (Cdg) are substantially added in parallel between the output terminals 2a, 2b and the short-circuited gate electrodes G.

On the other hand, the gate electrodes G of the FETs 3a and 3b are not electrically connected to each other and are not short-circuited in the example illustrated in FIG. 3. Therefore, the capacity (Cdg) between the gate electrode G and the drain electrode D can be reduced in comparison with the solid-state relay illustrated in FIG. 1.

Figure 4:
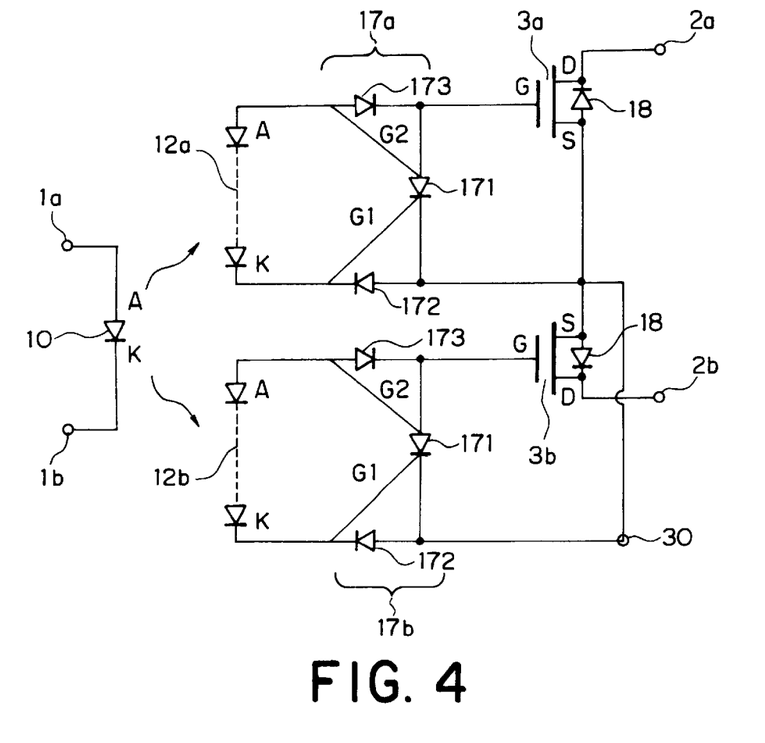
FIG. 4 is a circuit diagram showing an FET devices according to a first embodiment of this invention.

Referring to FIG. 4, description will be made about an FET device according to a first embodiment of this invention.

Herein, it is to be noted that the same reference numbers are attached for portions corresponding to FIG. 1 in the illustrated FET device.

Drain electrodes D of FETs 3a and 3b are connected to output terminals 2a and 2b, like in FIG. 1. Further, a gate circuit portion is independently connected to a gate electrode G of each FET 3a and 3b. In this event, each gate circuit portion has each photo-diode array 12a, 12b, as illustrated in FIG. 4. Further, each of discharge short circuits 17a and 17b is connected to an anode A and a cathode K of each photo-diode array 12a and 12b.

Each of the discharge short-circuits 17a and 17b has the same structure as the discharge short-circuit 17 illustrated in FIG. 1. Namely, each of the discharge short-circuits 17a and 17b includes an anode A, a cathode K and two gates consisting of a P-pole gate G1 and an N-pole gate G2, as illustrated in FIG. 4.

The P-pole gate G1 of the illustrated thyristor 171 is connected to the cathode K of each photo-diode array 12a, 12b. On the other hand, the N-pole gate G2 is connected to the anode A of each photo-diode array 12a, 12b.

Further, an anode and a cathode of the diode 172 are connected to the cathode K and the P-pole gate G1 of the tyristor 171 in each gate circuit portion, respectively. Moreover, the cathode and the anode of the diode 173 are connected to the anode A and the N-pole gate G2 of the thyristor 171, respectively.

Further, an optical signal is independently given to both photo-diode arrays 12a and 12b from a light-emitting device 10, and is independently converted into an electrical signal.

The FET device having this structure is operable as the solid-state relay, and has the low CR product of about 20 pF·Ω in a zero bias state, like in FIG. 1. Thereby, the FET device can control a high frequency exceeding 6 MHz.

Moreover, each of the discharge short circuit portions 17a and 17b is connected to each gate circuit portion. Consequently, charge accumulated in each gate electrode can be rapidly discharged.

Subsequently, description will be made about detail examples of the FET device according to the first embodiment illustrated in FIG. 4 with reference to FIGS. 5A and 5B.

The light-emitting device 10 is mounted on a lead flame 1b, which will be a cathode terminal (1b), and bonded with wire to the anode terminal and the lead flame 1a to electrically be connected. Thereby, a light emitting side flame 32 is structured.

Further, the FET 3a and the FET 3b, the photo-diode array 12a and photo-diode array 12b are mounted by the use of mount bonding on a photo-detecting side flame. In this event, the output terminal 2a, an output terminal 2b and the source terminal 2c are taken out from the photo-detecting side flame. Herein, the source terminal 2c is connected to the predetermined connection point 30.

Figures 5A, 5B:
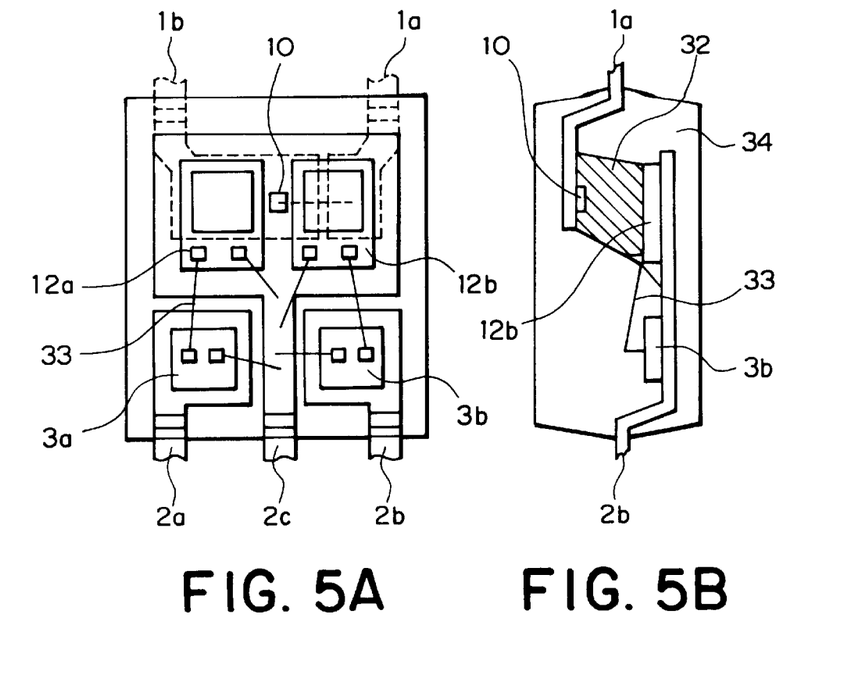
FIG. 5A is a perspective view of an FET device according to a first embodiment of this invention.
FIG. 5B is a cross sectional view of an FET device according to a first embodiment of this invention.

As shown in FIG. 5B, surfaces, on which a chip consisting of the light-emitting side flame and the photo-detecting side flame is mounted, are overlapped opposite to each other. Thereafter, a transparent resin 32, such as a silicon resin, which will becomes an optically coupled portion is injected, and is totally sealed with a mold resin 34, such as an epoxy resin.

Subsequently, description will be made about an operation of the FET device illustrated in FIGS. 4 and 5.

The light-emitting device 10 emits a light beam by applying a current between the anode terminal 1a and the cathode terminal 1b. When the photo-diode array 12a and the photo-diode array 12b detect or receive the light beam, a plus voltage is generated at the anode side of each photo-diode array 12a, 12b. Each of the FET 3a and FET 3b is turned on by this voltage, and is put into an operation state. In this state, each of the discharge short circuits 17a and 17b keeps an off state.

Next, no current flows through the light-emitting device 10, the carriers, which are collected in the gate electrodes G of the FET 3a and FET 3b, start discharging. However, the diodes 173 in the discharge shirt-circuits 17a and 17b prevent the discharge. Thereby, only leakage currents of the diodes 173 and the thyristors 171 are discharged because the thyristor 171 in each gate circuit is put into an off state.

In such a state that the thyristor does not operate, the gate potential of each of the FET 3a and FET 3b is reduced with duration between several hundreds msec. to several sec.

On the other hand, recombination of the carriers proceeds inside the photo-diode array 12a and the photo-diode array 12b, which lost the emitted light beam. Thereby, the voltage is quickly reduced in comparison with reduction of the gate potential.

In this event, when potential differences between the anode potential of the photo-diode array 12a and the gate potential of the FET 3a and between the anode potential of the photo-diode array 12b and the gate potential of the FET 3b exceeds a threshold voltage (about 0.6 V) of the thyristor 171 in the discharge short-circuit 17a and the discharge short-circuit 17b, the thyristor 171 is put into an on state to operate.

Consequently, the carriers, which are collected in the gates, are rapidly discharged via the thyristor 171.

Further, a p-layer of a reverse region and an n$^+$-layer of a source region are electrically short-circuited in order to prevent an operation of a transistor which is formed by an n-layer of a drain region, the p-layer and the n$^+$-layer in each of the FETs 3a and 3b.

Therefore, although parasitic diodes 18 are formed, each source electrode S of each FET 3a and 3b is short-circuited and is connected in series. Consequently, the reverse-blocking state can be kept in the bi-directions in the output terminal 2a and output terminal 2b.

In the illustrated example, Cdg (capacity between the drain and the gate) is not added between the output terminal 2a and the output terminal 2b because the gate electrode of each FET 3a, 3b is not electrically short-circuited. In consequence, the device capacitance between the output terminals 2a and 2b is equal to a value (Cds/2) in which a single device capacity Cds (capacity between the drain and source) is connected in series. Further, the on-resistance is equal to a value (2Ron) which is twice of the single device resistance (Ron). Therefore, the CR product is equal to Cds/2×2Ron=Cds×Ron. Thus, the same value as the CR product of a single piece can be realized.

In this event, when the FET which has the device capacity of the single piece of 2.4 pF by zero-bias, the on-resistance of 8.5Ω, and the device breakdown voltage of about 50 V is used, the CR product between the output terminal 2a and the output terminal 2b is equal to about 30 pF in the conventional circuit structure illustrated in FIG. 1.

In contrast, it is possible that the CR product becomes 20 pF·Ω near the zero-bias in the first embodiments illustrated in FIGS. 4 and 5.

Figures 6A, 6B:
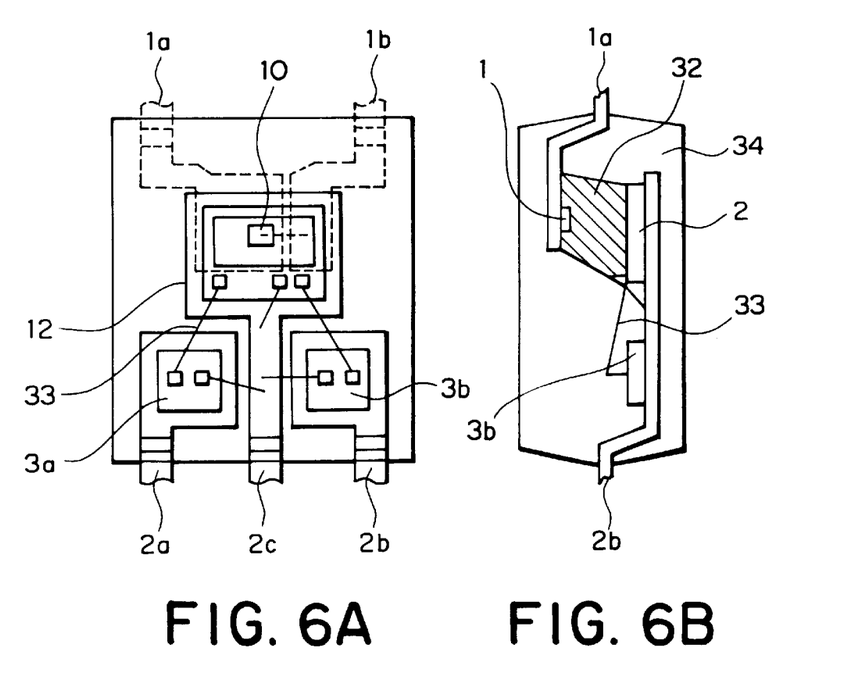
FIG. 6A is a perspective view of an FET device according to a second embodiment of this invention.
FIG. 6B is a cross sectional view of an FET device according to a second embodiment of this invention.

Referring to FIGS. 6A and 6B, an FET device according to a second embodiment of this invention is illustrated. This FET device is also used as the solid-state relay. In the drawing, the same reference numbers are attached to portions corresponding to FIG. 5.

In the first embodiment illustrated in FIGS. 4 and 5, two photo-diode arrays 12a and 12b are arranged. Consequently, the capacitance of the optically coupled portion consisting of the silicon resin becomes large. As a result, it is often difficult to keep stability in shape. Further, optical transmission efficiency from the light-emitting device 10 is largely variable in the two photo-detecting circuits consisting of two photo-diode arrays 12a and 12b.

From this viewpoint, the FET device illustrated in FIGS. 6A and 6B is designed so as to solve the above-mentioned demerit. This example is structured by a single photo-diode array 12, which integrates the two photo-diode arrays 2a, and the photo-diode array 2b illustrated in FIG. 5. In this case, the single photo-diode array 12 has three terminals, and is connected with wiring lines, like the example illustrated in FIG. 5.

Moreover, the photo-diode array 12 corresponding to each FET 3a, 3b is adjacent in this embodiment. Consequently, the difference of photo-detecting sensivity becomes small in the two photo-diode 12. As a result, it is possible to enhance operation simultaneity of the two FETs. This shows that variation of the operation time difference of the two FETs can be reduced to half by integrating in one chip as compared to the FET device according to the first embodiment.

Further, the chip-mount process for attaching the photo-diode array 12 can be reduced in the FET device illustrated in FIG. 6. In addition, the total chip area can be also reduced to achieve low cost.

Subsequently, description will be made about an FET device according to a third embodiment with reference to FIG. 7. The illustrated FET device is also used as the solid state relay.

Figure 7:
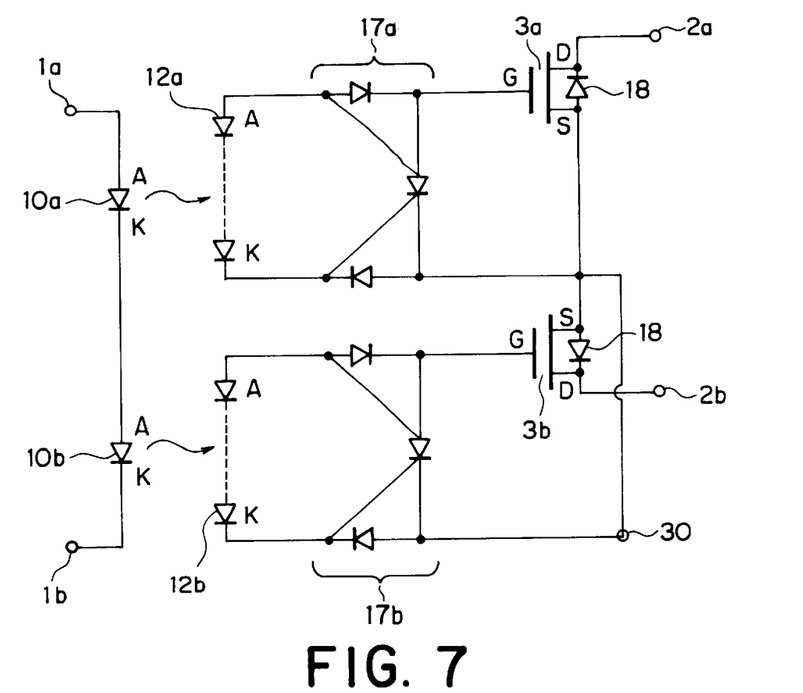
FIG. 7 is a circuit diagram showing an FET devices according to a third embodiment of this invention.

In the FET device illustrated in FIG. 7, the optical transmission efficiency difference is reduced in two photo-detecting circuits consisting of two photo-diode arrays 12a and 12b. As shown in FIG. 7, the two photo-diode arrays 12a and 12b are independently driven by different light-emitting devices 10a and 10b.

With such a structure, capacity of an optically coupled portion can be reduced. Consequently, the optical transmission efficiency becomes stable. Therefore, operation simultaneity of the two FETs is enhanced. Thereby, vibration of the operation time difference can be reduced to half in comparison with the first embodiment.

Reffering to FIG. 8, description will be made about an FET device according to a fourth embodiment of this invention.

Figure 8:
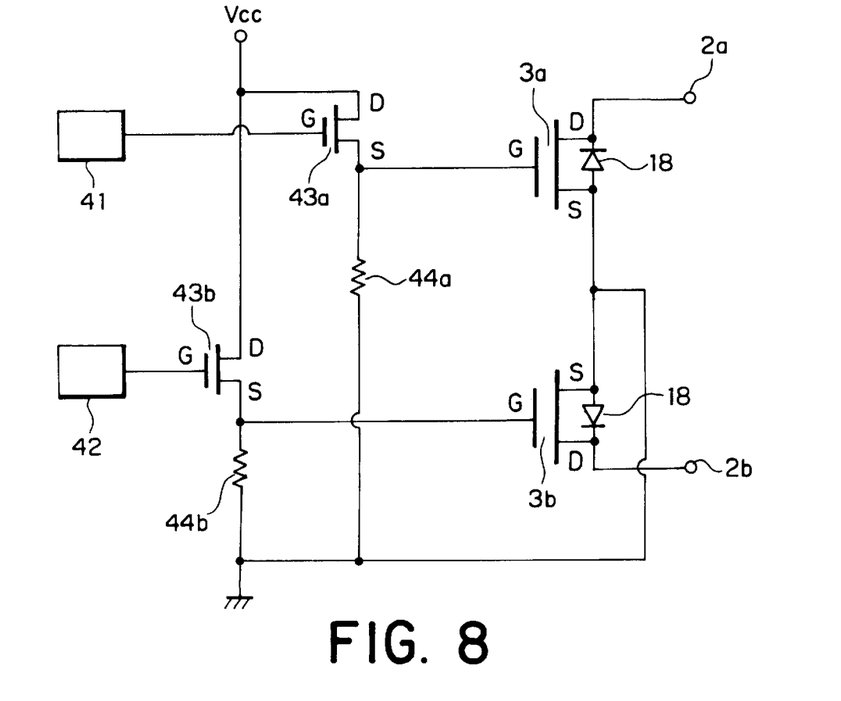
FIG. 8 is a circuit diagram showing an FET devices according to a fourth embodiment of this invention.

Although the photo-diode arrays 12,12a and 12b are used as the FET driving circuit in the embodiments illustrated FIGS. 3 through 7, the photo-diode array is not used in the example illustrated in FIG. 8.

More specifically, the illustrated FET device includes electrical signal generating portions, 41 and 42, which independently generate electrical signals as an input circuit. In this event, the electrical signal, which has frequency, amplitude and phase identical to each other, is supplied from the electrical signal generating portions 41 and 42.

These electrical signals are given to MOSFETs 43a and 43b for driving, respectively. As illustrated in FIG. 8, a power supply voltage Vcc is given to drain electrodes D of the driving MOSFETs 43a and 43b. Further, the source electrodes S are connected to the predetermined connection point (namely, ground point) via resistors 44a and 44b, and are connected to gate electrodes G of the FET 3a and 3b for an output.

In the illustrated example, the source electrodes S of the FET 3a and 3b are short-circuited to each other. Further, the drain electrodes D are connected to output terminals 2a and 2b, respectively.

In this event, each of the gate electrodes G is not electrically short-circuited, and is driven by the respective gate circuit portion. As mentioned above, when the source electrode S of each FET 3a, 3b is short-circuited, the CR product between the output terminals 2a and 2b is substantially identical with the single FET. As a result, the same effect as FIGS. 4 through 7 can be obtained.

In the above-mentioned embodiments, description has been made about the vertical type enhancement mode MOSFET. However, even when the other type FET is used, the CR product can be reduced.

Further, description has been made about the case that two FETs are used, this invention may be applied to a circuit having more FETs, and may be also applied for circuits other than the solid-state relay.

Moreover, description has been made about the case that the source electrodes of two FETs are short-circuited to each other in the illustrated example. However, the source electrode of one FET may be short-circuited from the drain electrode of the adjacent FET. In addition, two FETs may be electrically connected via impedance.

What is claimed is:

1. A FET device, comprising:

a pair of input terminals which are given a single control signal;

a pair of output terminals which supply a single output signal;

a plurality of FETs which are connected between the output terminals, and each of which has a source electrode, a drain electrode and a gate electrode; and driving circuits which are independently connected between the input terminals and said FETs, respectively;

either one of the source electrode and the drain electrode of at least one FET among said FETs being electrically connected to either one of the source electrode and drain electrode of the other FET to each other, said driving circuit having such a circuit structure that the gate electrodes of said FETs are not electrically short-circuited to each other, said FET being turned on and off in response to the single control signal.

2. A FET device as claimed in claim 1, wherein:

the source electrode of the at least one FET among said FETs is electrically short-circuited from the drain electrode of the other FET adjacent to the one FET.

3. A FET device, comprising:

a pair of input terminals which are given a single control signal;

a pair of output terminals which supply a single output signal;

a plurality of FETs which are connected between the output terminals, and each of which has a source electrode, a drain electrode and a gate electrode; and driving circuits which are independently connected between the input terminals and said FETs, respectively;

either one of the source electrode and the drain electrode of one FET among said FETs being electrically connected to either one of the source electrode and drain electrode of the other FET to each other, said driving circuit having such a circuit structure that the gate electrodes of said FETs are not electrically short-circuited to each other, said FET being turned on and off in response to the single control signal;

wherein the source electrode of the one FET among said FETs is electrically to the drain electrode of the other FET adjacent to the one FET via impedance.

4. A FET device, comprising:

a pair of input terminals, which are given a single control signal;

a pair of output terminals which supply a single output signal;

a plurality of FETs which are connected between the output terminals, and each of which has a source electrode, a drain electrode and a gate electrode; and driving circuits which are independently connected between the input terminals and said FETs, respectively;

said driving circuit having such a circuit structure that the source electrodes of said FETs are electrically connected to each other, each one of the gate electrodes of said FETs is independently electrically connected to a photo-diode array, and the gate electrodes of said FETs are not electrically short-circuited to each other, said FET being turned on and off in response to the single control signal.

5. A FET device, comprising:

a pair of input terminals which are given a single control signal;

a pair of output terminals which supply a single output signal;

a plurality of FETs which are connected between the output terminals, and each of which has a source electrode, a drain electrode and a gate electrode; and driving circuits which are independently connected between the input terminals and said FETs, respectively;

the source electrodes of said FETs being electrically connected to each other, each of said driving circuits having a predetermined connection point, and being connected between each of the gate electrodes of said FETs and the predetermined connection point, and having a gate circuit portion which independently drives the gate electrode, said FETs being turned on and off in response to the single control signal.

6. A FET device as claimed in claim 5, wherein:

said driving circuit is coupled to said input terminals and has an input circuit independently driving said FET via said gate circuit portion in accordance with an input electrical signal given as the control signal to the input terminals.

7. A FET device as claimed in claim 6, wherein:

said input circuit further includes a converting portion which converts the input electrical signal into an optical signal.

8. A FET device, comprising:

a pair of input terminals which are given a single control signal;

a pair of output terminals which supply a single output signal;

a plurality of FETs which are connected between the output terminals, and each of which has a source electrode, a drain electrode and a gate electrode; and driving circuits which are independently connected between the input terminals and said FETs, respectively;

the source electrodes of said FETs being electrically connected to each other, each of said driving circuits having a predetermined connection point, and being connected between each of the gate electrodes of said FETs and the predetermined connection point, and having a gate circuit portion which independently drives the gate electrode, said FETs being turned on and off in response to the single control signal;

wherein said driving circuit is coupled to said input terminals and has an input circuit which independently drives said FET via said gate circuit portion in accordance with an input electrical signal given as the control signal to the input terminals; and said gate circuit has a converting means which converts the optical signal into a driving electrical signal, and a circuit means which independently provides the driving electrical signal from said converting means to the gate electrode of said FET.

9. A FET device as claimed in claim 8, wherein:

said converting means is independently arranged in accordance with said FET.

10. A FET device as claimed in claim 8, wherein:

said converting means further comprises a plurality of said gate circuit portions in common.

11. A FET device as claimed in claim 7, wherein:

said converting portion includes a single light-emitting device portion.

12. A FET device as claimed in claim 8, wherein:

said input circuit includes a converting portion which converts the input electrical signal into an optical signal;

said converting portion includes a plurality of light-emitting device portions.

13. A FET device as claimed in claim 6, wherein:

said input circuit has an electrical circuit receiving an input electrical signal that is independently given to the input terminals and independently generates a gate driving electrical signal.

14. A FET device as claimed in claim 5, wherein:

said gate circuit portion includes both the predetermined connection point, and a short circuit is arranged between the gate electrodes.

15. A FET device, comprising:

a pair of input terminals which are given a single control signal;

a pair of output terminals which supply a single output signal;

a plurality of FETs which are connected between the output terminals, and each of which has a source electrode, a drain electrode and a gate electrode; and driving circuits which are independently connected between the input terminals and said FETs, respectively;

the source electrodes of said FETs being electrically connected to each other, each of said driving circuits having a predetermined connection point, and being connected between each of the gate electrodes of said FETs and the predetermined connection point, and having a gate circuit portion which independently drives the gate electrode, said FETs being turned on and off in response to the single control signal;

said gate circuit portion includes both the predetermined connection point, and a short circuit is arranged between the gate electrodes; and said gate circuit portion includes a photo-detecting device portion having two terminals, said short circuit connected between the two terminals of said photo-detecting device portion.

16. A FET device as claimed in any of claims 1 through 14, wherein the output signal has a frequency of greater than 6 MHz.

17. A solid-state relay which is composed of said FET device claimed in any of claims 1 through 15.

18. A FET device, comprising:

a pair of input terminals which are given a single control signal;

a pair of output terminals which supply a single output signal;

a plurality of FETs connected between the output terminals, each of which has a source electrode, a drain electrode and a gate electrode; and gate driving circuits which are independently connected between the input terminals and said FETs;

the source electrodes of said FETs being electrically connected to each other, gate circuit portions which are connected to the gate electrodes of said FETs so that the capacity between the gate electrode and the drain electrode of each of said FETs is connected in series between the two output terminals, said FET being turned on and off in response to the single control signal.

19. A FET device, comprising:

a pair of input terminals which are given a single control signal;

a pair of output terminals which supply a single output signal;

a plurality of FETs which are connected between the output terminals, each of which has a source electrode, a drain electrode and a gate electrode; and gate driving circuits which are independently connected between the input terminals and said FETs;

the source electrodes of said FETs being electrically connected to each other, gate circuit portions which are connected to the gate electrodes of said FETs so that the capacity between the gate electrode and the drain electrode of each of said FETs is connected in series between the two output terminals, said FET being turned on and off in response to the single control signal; and the source electrodes of said FETs are electrically short-circuited from the gate electrodes.

20. A FET device as claimed in claim 19, wherein:

a mathematical product of an electrical capacity and an electrical resistance between the output terminals is substantially equal to a mathematical product of an electrical capacity and an electrical resistance between the gate electrode and the drain electrode of each of said FETs.

21. A solid state relay, comprising:

a pair of input terminals which are given a single control signal;

a pair of output terminals which supply a single output signal;

a solid state switching device which is connected between the input terminals; and a driving circuit which is connected to said solid state switching device, said driving circuit having such a structure that an output signal having a frequency of greater than 6 MHz passes through said solid state switching device and the output terminals.

* * * * *